United States Patent
Watanabe et al.

(10) Patent No.: US 7,616,250 B2
(45) Date of Patent: Nov. 10, 2009

(54) IMAGE CAPTURING DEVICE

(75) Inventors: Naoyuki Watanabe, Kawasaki (JP);
Toshiyuki Honda, Kawasaki (JP);
Yoshito Akutagawa, Kawasaki (JP);
Susumu Moriya, Kawasaki (JP); Izumi Kobayashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 502 days.

(21) Appl. No.: 10/994,634

(22) Filed: Nov. 23, 2004

(65) Prior Publication Data

US 2006/0023108 A1      Feb. 2, 2006

(30) Foreign Application Priority Data

Jul. 27, 2004    (JP) ............... 2004-218913

(51) Int. Cl.
*H04N 5/225*    (2006.01)
*H01L 21/00*    (2006.01)

(52) U.S. Cl. .............. 348/340; 348/374; 257/432; 257/433; 257/434; 438/116

(58) Field of Classification Search .............. 348/374, 348/340; 257/434; 438/116; 600/181
See application file for complete search history.

(56) References Cited

U.S. PATENT DOCUMENTS

| | | | | |
|---|---|---|---|---|
| 4,520,469 A * | 5/1985 | Todokoro et al. | ........ | 369/44.41 |
| 4,521,469 A * | 6/1985 | Butt et al. | .......... | 428/35.9 |
| 5,749,827 A * | 5/1998 | Minami | .......... | 600/109 |
| 5,949,655 A * | 9/1999 | Glenn | .......... | 361/783 |
| 6,221,687 B1 * | 4/2001 | Abramovich | .......... | 438/70 |
| 6,492,699 B1 * | 12/2002 | Glenn et al. | .......... | 257/433 |
| 6,515,269 B1 * | 2/2003 | Webster et al. | .......... | 250/208.1 |
| 6,774,109 B2 * | 8/2004 | Dunmore et al. | .......... | 514/16 |
| 6,906,403 B2 * | 6/2005 | Bolken et al. | .......... | 257/678 |
| 7,405,100 B1 * | 7/2008 | Mostafazadeh et al. | .......... | 438/68 |
| 7,535,509 B2 * | 5/2009 | Takayama | .......... | 348/340 |
| 2003/0151124 A1 | 8/2003 | Badehi | | |

FOREIGN PATENT DOCUMENTS

| | | | |
|---|---|---|---|
| JP | 62-67863 | | 3/1987 |
| JP | 62067863 A | * | 3/1987 |
| JP | 63-271969 A | | 11/1988 |
| JP | 02267957 A | * | 11/1990 |

(Continued)

OTHER PUBLICATIONS

Korean Office Action dated Jun. 12, 2007, Application No. 10-2007-0023927.

(Continued)

*Primary Examiner*—Sinh Tran
*Assistant Examiner*—Wanda M Negron
(74) *Attorney, Agent, or Firm*—Westerman, Hattori, Daniels & Adrian, LLP

(57) ABSTRACT

An image capturing device is disclosed that includes a light receiving element having a light receiving surface, a plate-like transparent member provided on the light receiving surface of the light receiving element, and resin provided to at least the periphery of the plate-like transparent member. The plate-like transparent member includes a first principal plane positioned on the light receiving element side and a second principal plane opposite the first principal plane. The first principal plane is greater in area than the second principal plane.

11 Claims, 14 Drawing Sheets

FOREIGN PATENT DOCUMENTS

| | | |
|---|---|---|
| JP | 04-023469 A | 1/1992 |
| JP | 4-309060 A | 10/1992 |
| JP | 5-075934 A | 3/1993 |
| JP | 5-110960 A | 4/1993 |
| JP | 5-136384 A | 6/1993 |
| JP | 2000-323692 | 11/2000 |
| JP | 2002-16194 | 1/2002 |
| JP | 2002-270859 | 9/2002 |
| JP | 2002-329850 A | 11/2002 |

OTHER PUBLICATIONS

Korean Office Action dated Aug. 28, 2006.
Office Action dated Nov. 23, 2007 issued in corresponding Chinese Application No. 2004 10100215.7.
Office Action issued May 23, 2008 in corresponding Chinese Appln. No. 2004101002157.
Japanese Office Action dated Feb. 10, 2009 issued in corresponding Japanese Application No. 2004-218913.
Japanese Office Action issued in Japanese Appln. 2004-218913, mailed Oct. 21, 2008.

* cited by examiner

IMAGE CAPTURING DEVICE

CROSS-REFERENCE TO RELATED APPLICATION

The present application is based on Japanese Priority Patent Application No. 2004-218913, filed on Jul. 27, 2004, the entire contents of which are hereby incorporated by reference.

BACKGROUND OF THE INVENTION

1. Field of the Invention

The present invention relates generally to image capturing devices, and more particularly to an image capturing device in which a transparent member is provided on the light receiving surface side of an image capturing element (a light receiving element).

2. Description of the Related Art

Image capturing devices using a CCD or a CMOS image sensor as an image capturing element (a light receiving element) have the image capturing element contained inside a package and have a transparent member such as a glass plate on the light receiving surface of the image capturing element so that external light enters the image capturing element through the transparent member as shown in, for instance, Japanese Laid-Open Patent Application Nos. 62-067863 (Patent-Related Document 1), 2000-323692 (Patent-Related Document 2), and 2002-016194 (Patent-Related Document 3).

Patent-Related Document 1 discloses a structure in which: a semiconductor substrate is mounted on leads; the electrodes of the semiconductor substrate are connected to the leads by bonding wires; a glass plate is bonded onto the semiconductor substrate with a transparent adhesive agent; and the semiconductor substrate and the leads are sealed with resin including a black pigment and functioning as light absorbing material with the surface of the glass plate being exposed.

Patent-Related Document 2 discloses a structure in which: a chip having a light receiving part is mounted on a package with leads; a microlens group is bonded onto the chip using resin of a low refractive index; a light transmitting substrate is provided on the microlens group through a color filter; and water-repellent resin is provided on the periphery of the low refractive index resin and the light transmitting substrate.

Patent-Related Document 3 discloses a structure in which: a semiconductor element is mounted on a base body; the electrodes of the semiconductor element and electrode pads provided to the base body are connected by bonding wires; a light transmitting member is provided on the semiconductor element through UV curable resin provided to the pads; and sealing resin is provided so as to cover the entire side surfaces of the semiconductor element, the UV curable resin, and the light transmitting member.

According to the technique disclosed in Patent-Related Document 1, the glass plate is shaped like a rectangular parallelepiped, and sealing is performed by providing the sealing resin around the glass plate. The glass plate has a rectangular parallelepiped shape with its peripheral surface being perpendicular to the upper surface (light receiving surface) of the semiconductor substrate. Accordingly, unnecessary light (light that does not contribute to image capturing) entering the peripheral surface reflects on the interface between the peripheral surface and the resin so as to be likely to enter the light receiving surface (an image capturing area). When the unnecessary light enters the light receiving surface, optical characteristics are impaired, thus causing a flare or ghost.

Further, according to the technique disclosed in Patent-Related Document 1, the glass plate is bonded to the semiconductor substrate with a transparent adhesive agent. On the other hand, according to the technique disclosed in Patent-Related Document 2, the low refractive index resin is interposed between the chip and the microlens group, and its periphery is sealed by the water-repellant resin. Further, according to the technique disclosed in Patent-Related Document 3, a space is provided between the light receiving part of the semiconductor element and the light transmitting member, and the periphery of the space is sealed by the UV curable resin and the sealing resin.

Therefore, according to the techniques disclosed in Patent-Related Documents 1 through 3, when heat is applied to the devices thereof, the transparent adhesive agent in Patent-Related Document 1, the low refractive index resin in Patent-Related Document 2, and the air inside the space between the semiconductor element and the light transmitting member in Patent-Related Document 3 expand thermally, so that the glass plate, the light transmitting substrate, and the light transmitting member receive pressure-induced forces in directions perpendicular to the semiconductor substrate, the chip, and the semiconductor element, respectively. As a result, the glass plate, the light transmitting substrate, and the light transmitting member may be displaced by the forces.

Further, according to the techniques disclosed in Patent-Related Documents 1 through 3, wires are used to connect the semiconductor substrate and the leads in Patent-Related Document 1, the chip and leads in Patent-Related Document 2, and the semiconductor element and the base body in Patent-Related Document 3. The wires are provided by wire bonding. In the case of covering a light receiving area with the glass plate, the light transmitting substrate, or the light transmitting member before providing the wires, it is necessary to avoid contacting the glass plate, the light transmitting substrate, or the light transmitting member with a bonding capillary.

Therefore, it is required to increase the distance between the peripheral sides of the glass plate, the light transmitting substrate, or the light transmitting member and electrode pads to which the wires are connected. Accordingly, it is required to reduce the size of the glass plate, the light transmitting substrate, or the light transmitting member, or increase the chip size of the semiconductor substrate, the chip, or the semiconductor element. However, if the glass plate, the light transmitting substrate, or the light transmitting member is reduced in size, light reflected by its end faces is likely to enter an image-capturing area so as to hinder optical characteristics. On the other hand, an increase in chip size works against the size reduction of image capturing devices.

SUMMARY OF THE INVENTION

Accordingly, it is a general object of the present invention to provide an image capturing device in which the above-described disadvantages are eliminated.

A more specific object of the present invention is to provide an image capturing device having a transparent member such as a glass plate provided on the light receiving surface of an image capturing element, in which the displacement of the transparent member and the entrance of unnecessary light into the light receiving part of the image capturing element can be prevented while the image capturing device is reduced in size.

The above objects of the present invention are achieved by an image capturing device, including: a light receiving element having a light receiving surface; a plate-like transparent member provided on the light receiving surface of the light receiving element; and resin provided to at least a periphery of the plate-like transparent member, wherein the plate-like transparent member includes a first principal plane positioned on a side toward the light receiving element and a second principal plane opposite the first principal plane, the first principal plane being greater in area than the second principal plane.

According to the above-described image capturing device, a plate-like transparent member is provided on the light receiving surface of a light receiving element, and the first principal plane of the transparent member positioned on the light receiving element side is greater in area than the second principal plane thereof (outer surface) opposite the first principal plane. According to this configuration, the displacement of the transparent member can be prevented, and the entrance of unnecessary light can be controlled. As a result, the reliability and the optical characteristics of the image capturing device can be improved. Further, it is possible to reduce the size of the image capturing device while preventing interference with a bonding capillary in its manufacturing process.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given below, with reference to the accompanying drawings, of embodiments of the present invention.

Figure 1:
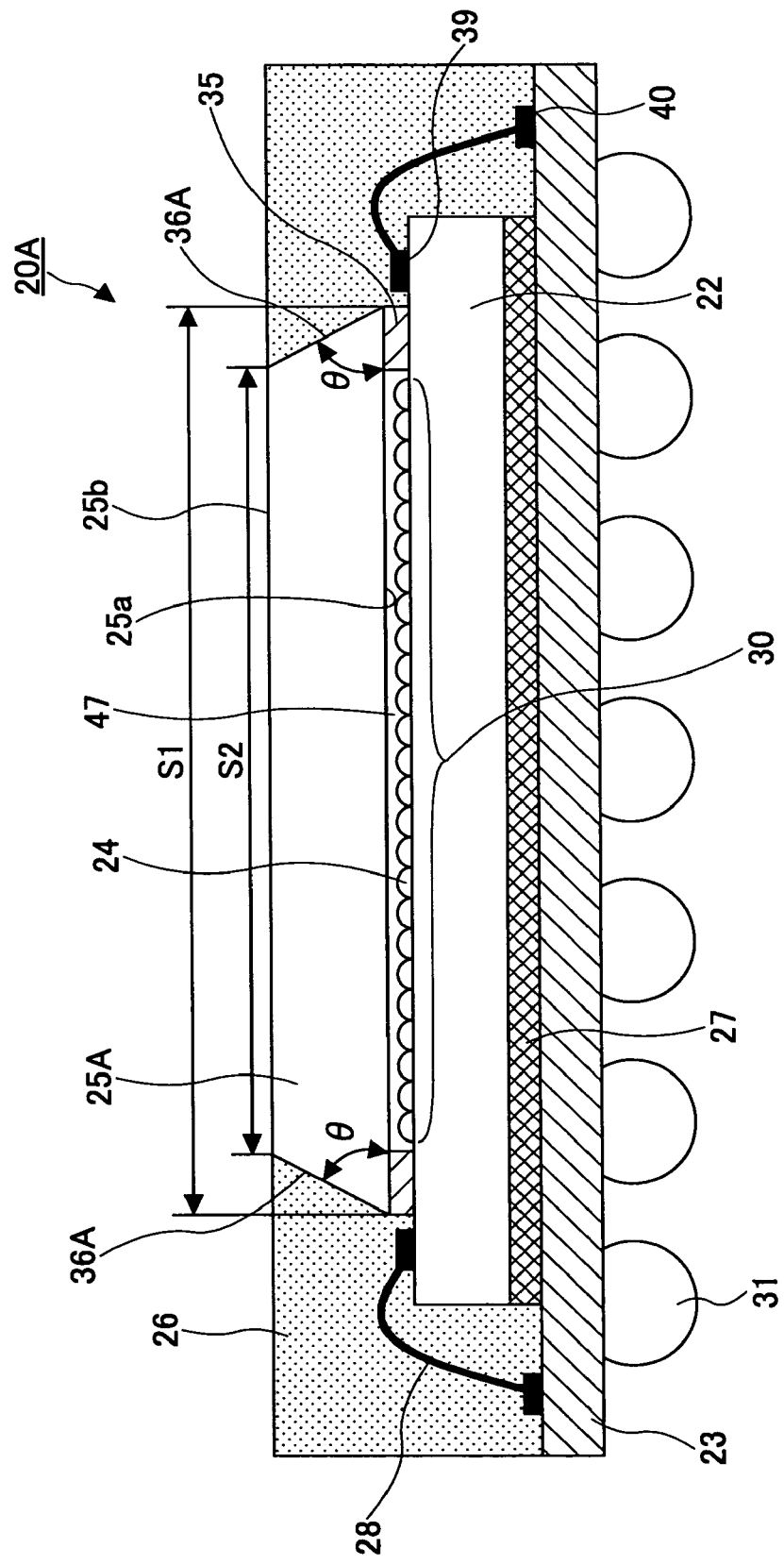
FIG. 1 is a cross-sectional view of an image capturing device according to a first embodiment of the present invention.
Figure 2:
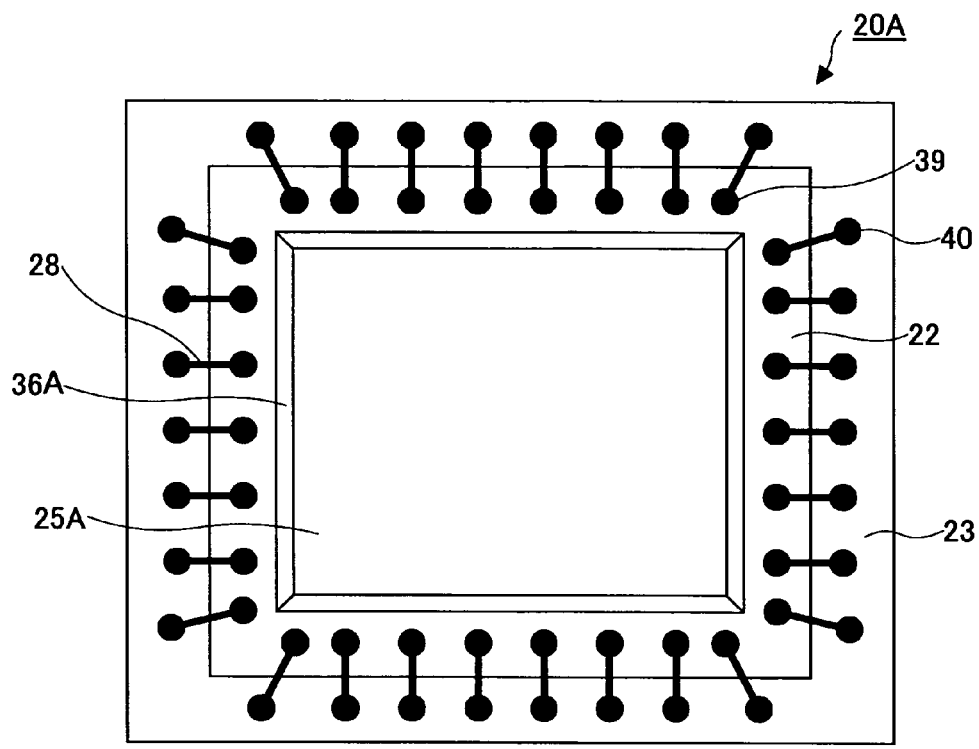
FIG. 2 is a plan view of the image capturing device from which sealing resin is removed according to the first embodiment of the present invention.

FIGS. 1 and 2 shows an image capturing device 20A, which is a first embodiment of the image capturing device according to the present invention. FIG. 1 is a cross-sectional view of the image capturing device 20A. FIG. 2 is a plan view of the image capturing device 20A from which sealing resin 26 is removed.

In this embodiment, the image capturing device 20A includes an image capturing element (light receiving element) 22, a support substrate 23, a microlens 24, a plate-like transparent member 25A, the sealing resin 26, and external connection terminals 31. The image capturing element 22, which is composed of a CMOS image sensor, is mounted on and adhered to the support substrate 23 via a die bonding material 27 with a light receiving surface 30 of the image capturing element 22 facing upward.

Multiple photodiodes are formed in a matrix-like manner (not graphically represented) on the light receiving surface 30 (the image capturing area) of the image capturing element 22. The microlens 24 is provided on the photodiodes with a color filter layer (not graphically represented) being provided therebetween. The color filter layer is formed of, for instance, photoresist (photosensitive resin) to which a pigment is added, and is divided into regions corresponding to the individual photodiodes. The regions are arranged in a predetermined order with each region being colored one of the three primary colors (R, G, and B).

The microlens 24 is formed of, for instance, positive photoresist. The microlens 24 is formed as an aggregate of multiple lenses each having a substantially hemispheric shape by photoetching technology and reflow technology, or transfer technology. Each lens body gathers incident light to the light receiving part of a corresponding one of the photodiodes.

The support substrate 23 is formed of a multilayer interconnection board whose base material is glass epoxy resin. On its surface and/or in its inside, interconnections and interlayer connection vias (not graphically represented) are formed. Bonding pads 40 for wire connection are formed on the surface (upper surface) of the support substrate 23 on which the image capturing element 22 is mounted. Lands (not graphically represented) are formed on the surface (lower surface) of the support substrate 23 on the other side. The support substrate 23 is also referred to as an interposer.

Electrode pads 39 of the image capturing element 22 and the bonding pads 40 provided on the support substrate 23 are electrically connected by wires 28 formed of gold (Au) lines.

On the other hand, the external connection terminals 31 formed of solder balls are provided on the lands formed on the lower surface of the support substrate 23. Accordingly, the electrode pads 39 of the image capturing device 22 are electrically connected to the external connection terminals 31 via the wires 28 and the interconnections and the interlayer connection vias of the support substrate 23.

On the other hand, the plate-like transparent member 25A formed of transparent glass is provided on the light receiving surface 30 (the image capturing area) of the image capturing element 22 via a spacer 35. The transparent member 25A is provided so that a first principal plane 25a thereof positioned on the image capturing element 22 side is parallel to the light receiving surface 30 of the image capturing element 22. A second principal plane 25b of the transparent member 25A positioned on the opposite outer side is parallel to the first principal plane 25a.

As a result of providing the transparent member 25A on the image capturing element 22 via the spacer 35 formed of photoresist, a space 47 is formed between the image capturing element 22 and the transparent member 25A. Air exists in the space 47. The spacer 35 may be formed of other materials such as epoxy resin.

The light gathering characteristics of the microlens 24 are determined by a lens shape and the difference in refractive index from a member provided on the incident light side of the microlens 24 on the optical path of incident light. In general, the refractive index of the microlens 24 is approximately 1.55 (which may vary to some extent depending on material), and the refractive index of air is 1. Accordingly, with air existing around the microlens 24 (between the microlens 24 and the transparent member 25A), the light gathering characteristics of the microlens 24 are maximized.

Here, the term "transparent" indicates transparency to the light receiving area of the image capturing element 22. When the object of the image capturing element 22 is visible light, the term "transparent" indicates transparency to the visible light. Further, the surface of the transparent member 25A is provided with an AR (antireflection) coating and/or an IR (infrared reflecting) coating as required.

In the above-described configuration, the area (S1) of the first principal plane 25a of the plate-like transparent member 25A positioned on its image capturing element 22 side is greater than the area (S2) of the second principal plane 25b thereof on the outer side (S1>S2). At this point, a side surface 36A of the transparent member 25A is inclined at an acute angle θ to the first principal plane 25a, and is inclined at an obtuse angle to the second principal plane 25b of the transparent member 25A. In this embodiment, the side surface 36A includes inclined surfaces having a uniform inclination.

The sealing resin 26 has a filler and/or a dye mixed therein so as to have a light blocking characteristic. The sealing resin 26 seals the image capturing element 22, the transparent member 25A, and the wires 28 on the support substrate 23, and covers the side surface 36A of the transparent member 25A. At this point, the transparent member 25A, including its inclination part of the side surface 36A, is covered with the sealing resin 26 so that the second principal surface 25b thereof is exposed therefrom.

Thus, the transparent member 25A, including its inclination part, is sealed in the sealing resin 26, so that it is ensured that the transparent member 25A is held. This configuration prevents the transparent member 25A from being removed from the sealing resin 26, thus providing the image capturing device 20A with high reliability.

As described above, the space 47 is formed between the image capturing element 22 and the transparent member 25A in the image capturing device 20A, and air exists in the space 47. Accordingly, when the image capturing element 22 and the transparent member 25A are heated at the time of or after being sealed by the sealing resin 26 so that the air of the space 47 expands, a pressure-induced force is applied to the transparent member 25A in the upward direction of FIG. 1 (in the upward direction perpendicular to the light receiving surface 30).

According to the structure of this embodiment, the side surface 36A of the transparent member 25A is inclined. The inclination part of the side surface 36A of the transparent member 25A is supported from above by the sealing resin 26, and is in contact with the sealing resin 26 with a large contact area. Therefore, even when the air inside the space 47 expands to apply pressure to the transparent member 25A, it is possible to prevent the transparent member 25A from being displaced from the sealing resin 26, thus providing the image capturing device 20A with high reliability.

This point is described below in more detail using FIG. 3, which shows part of the interface between the side surface 36A of the transparent member 25A and the sealing resin 26. A consideration is given of a force exerted on a position indicated by point P in FIG. 3 on the contact surface of the side surface 36A of the transparent member 25A and the sealing resin 26, that is, the side surface 36A of the transparent member 25A.

Figure 3:
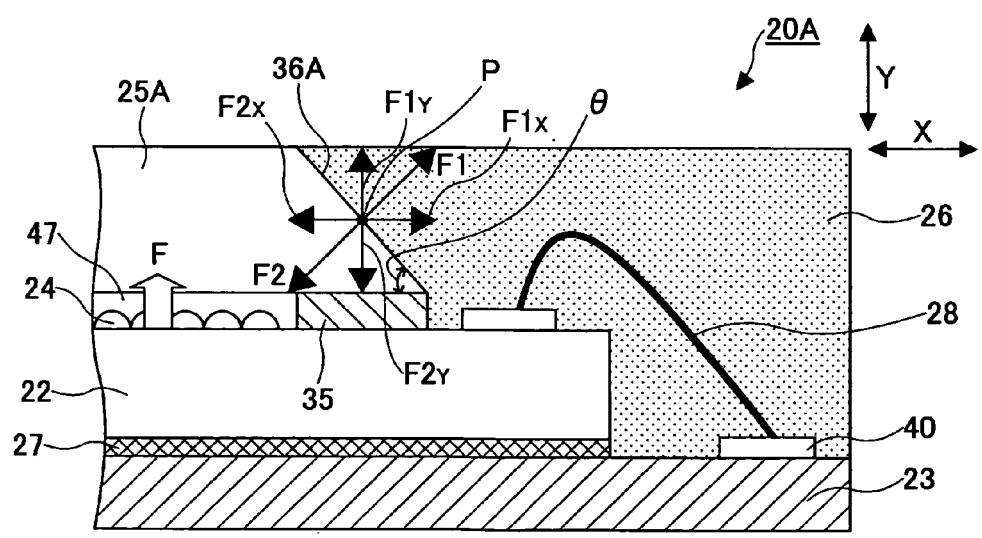
FIG. 3 is an enlarged view of part of the image capturing device according to the first embodiment of the present invention.

It is assumed that the air inside the space 47 between the microlens 24 and the transparent member 25A expands so as to generate a pressure-induced force F to push up the transparent member 25A in the upward direction of FIG. 3 and that a stress-associated force F1 for the transparent member 25A to press the sealing resin 26 is generated at point P by the pressure-induced force F. As the reaction of the stress-associated force F1, a force F2 for the sealing resin 26 to press (hold) the transparent member 25A (hereinafter referred to as "holding force F2") is generated. When each of the stress-associated force F1 and the holding force F2 is decomposed into the X and Y directions of FIG. 3, the stress-associated force F1 is decomposed into $F1_X$ and $F1_Y$, and the holding force F2 is decomposed into $F2_X$ and $F2_Y$.

The divided force $F2_Y$ of the holding force F2 for the sealing resin 26 to hold the transparent member 25A is exerted in the vertically downward direction, and the divided force $F2_X$ thereof is exerted in the horizontally inward direction. That is, the holding force F2 acts as a force to hold the transparent member 25A in its original position against the pressure-induced force F. Thus, in the transparent member 25A, the area S1 of its first principal plane 25a is greater than the area S2 of its second principal plane 25b, and its side surface 36A is inclined. As a result, a force to hold the transparent member 25A in its original position is exerted between the transparent member 25A and the sealing resin 26. Therefore, even when the pressure-induced force F in the direction to displace the transparent member 25A is exerted thereon, it can be ensured that the transparent member 25A is prevented from being displaced from the sealing resin 26, thus increasing the reliability of the image capturing device 20A.

Figure 4:
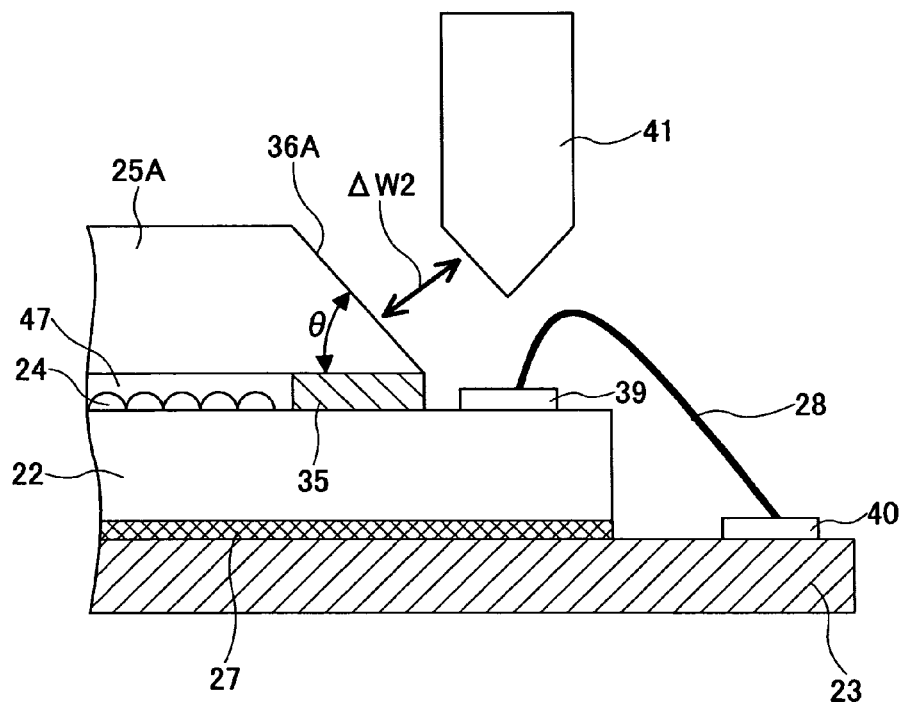
FIG. 4 is a diagram for illustrating effects of the image capturing device according to the first embodiment of the present invention.

Further, in the transparent member 25A, the side surface 36A is inclined at an acute angle θ to the first principal plane 25a. As a result, as shown in FIG. 4, in the case of performing wire bonding on the electrode pads 39 of the image capturing element 22 using a bonding capillary 41, it is possible to prevent the bonding capillary 41 from coming into contact with the transparent member 25A. Accordingly, the transparent member 25A does not have to be reduced in size, nor does the image capturing element 22 have to be increased in chip size. Consequently, the image capturing device 20A reduced in size and having good optical characteristics can be realized. In FIG. 4, ΔW2 is the clearance between the side surface 36A of the transparent member 25A and the bonding capillary 41.

Figure 5:
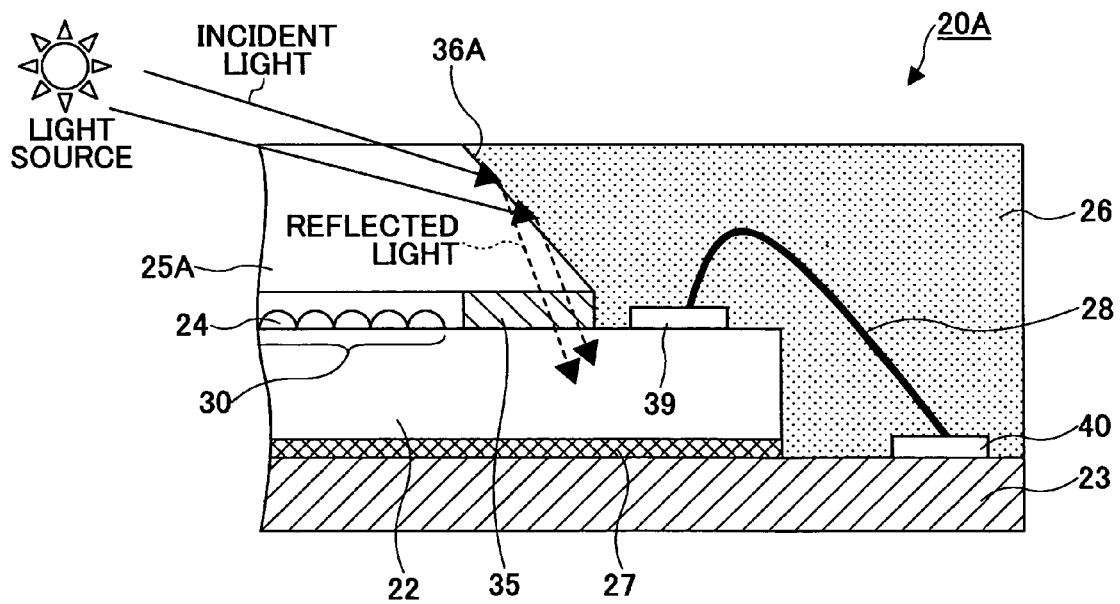
FIG. 5 is a diagram for illustrating effects of the image capturing device according to the first embodiment of the present invention.

In the image capturing device 20A, the peripheral part of the transparent member 25A is formed of the side surface 36A having an acute angle θ to the first principal plane 25a. As a result, as shown in FIG. 5, light reflected from the interface between the side surface 36A of the transparent member 25A and the sealing resin 26 travels in a direction away from the light receiving surface 30 (the light receiving area) of the image capturing element 22. Accordingly, the entrance of the reflected light into the light receiving surface 30 (the light receiving area) of the image capturing element 22 is controlled or reduced. As a result, a flare or ghost resulting from unnecessary light that does not contribute to image capturing (hereinafter referred to as "unnecessary light") can be prevented from occurring, so that the optical characteristics of the image capturing device 20A can be improved.

The inclination angle θ of the side surface 36A that can control the occurrence of a flare or ghost is determined by the angle of light that enters the side surface 36A of the transparent member 25A and the refractive indexes of the transparent member 25A and the sealing resin 26. For instance, if the angle of light that enters the side surface 36A is 45°, it is desirable that that inclination angle θ of the side surface 36A be also set to 45°.

Next, a description is given below, with reference to FIGS. 6 and 7, of a second embodiment of the image capturing device according to the present invention.

Figure 6:
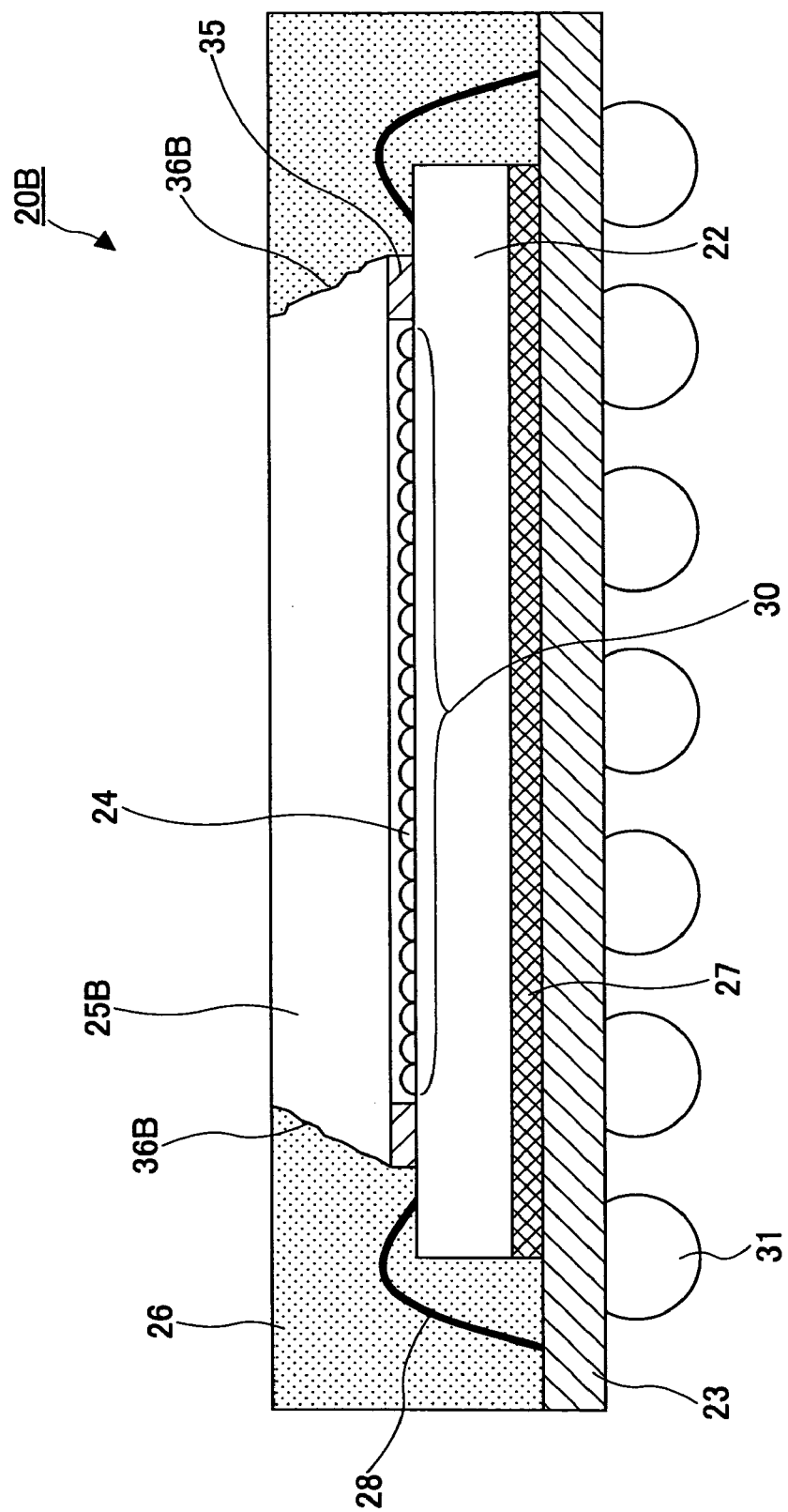
FIG. 6 is a cross-sectional view of an image capturing device according to a second embodiment of the present invention.

FIG. 6 is a cross-sectional view of an image capturing device 20B according to the second embodiment. In FIG. 6, the same elements as those described in the first embodiment are referred to by the same numerals, and a description thereof is omitted. The same applies to the drawings of the below-described other embodiments.

Figure 7:
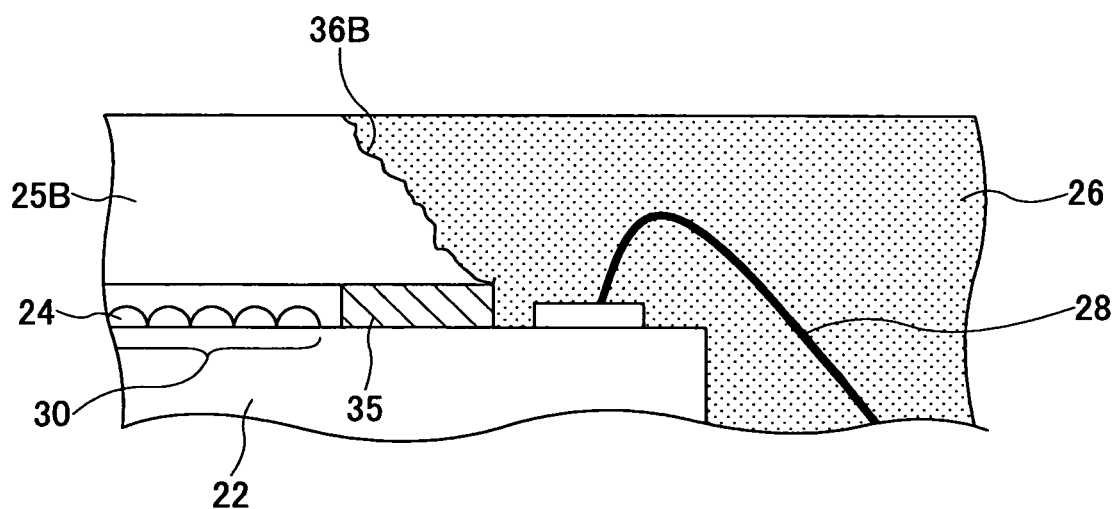
FIG. 7 is an enlarged view of part of the image capturing device according to the second embodiment of the present invention.

As shown enlarged in FIG. 7, in the image capturing device 20B according to the second embodiment, a side surface 36B of a transparent member 25B is roughened. As in the above-described first embodiment, the side surface 36B of the transparent member 25B is inclined. The side surface 36B of the transparent member 25B is roughened. As a result, of light entering the transparent member 25B, light reaching the side surface 36B is scattered, so that the amount of light entering the light receiving surface 30 (image capturing area) as reflected light is extremely reduced. In consequence, reduction in the optical characteristics of the image capturing device 20B is controlled.

Further, the area of contact of the sealing resin 26 and the side surface 36B of the transparent member 25B is substantially increased. As a result, the transparent member 25B can be fixed more firmly to the sealing resin 26, so that the image capturing device 20B can have increased reliability. In order to roughen the side surface 36B of the transparent member 25B, a mold for molding the transparent member 25B of which part corresponding to the side surface 36B is preroughened may be employed. Alternatively, the side surface 36B of the transparent member 25B may be roughened by sand blasting after the transparent member 25B is molded.

Next, a description is given of a third embodiment of the image capturing device according to the present invention.

Figure 8:
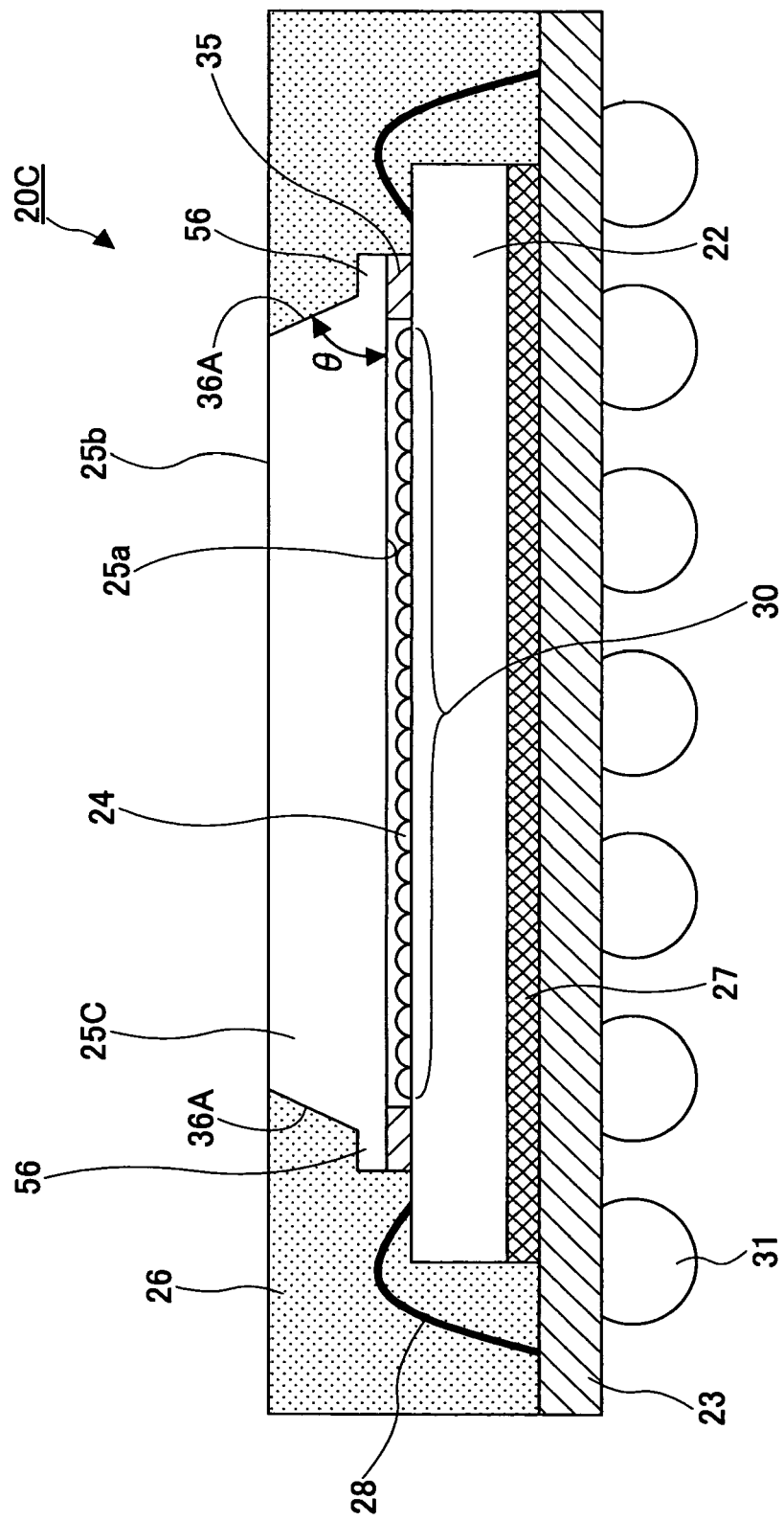
FIG. 8 is a cross-sectional view of an image capturing device according to a third embodiment of the present invention.

FIG. 8 is a cross-sectional view of an image capturing device 20C according to the third embodiment. In the image capturing device 20C according to the third embodiment, a flange part 56 is provided on the side surface 36A of a transparent member 25C on its first principal plane 25a side. In the transparent member 25C, the first principal plane 25a positioned on the image capturing element 22 side is also greater in area than the second principal plane 25b positioned on the outer side, and an acute angle θ is also formed between the side surface 36A and the first principal plane 25a. The provision of the flange part 56 substantially increases the area of contact of the transparent member 25C and the sealing resin 26.

The flange part 56 is provided on the first principal plane 25a side. As a result, in the resin sealing structure, the flange part 56 produces the so-called anchoring effect. Therefore, even when pressure due to thermal expansion is exerted on the transparent member 25C, it is ensured that the transparent member 25C is held inside the sealing resin 26. Accordingly, the image capturing device 20C has high reliability. The side surface 36A and the surface of the flange part 56 of the transparent member 25C may also be roughened as in the above-described second embodiment.

Figure 9A:
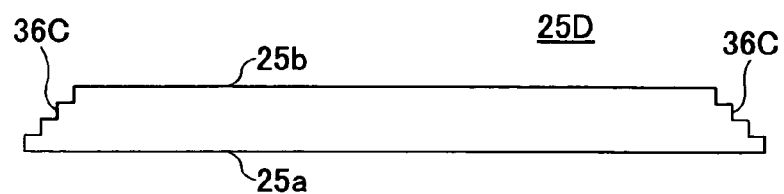
FIGS. 9A through 9C are diagrams for illustrating variations of a transparent member according to the third embodiment of the present invention.
Figure 9B:
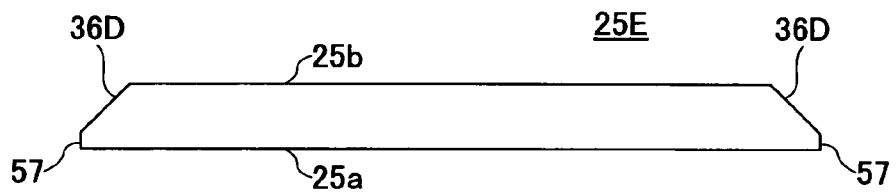
Figure 9C:
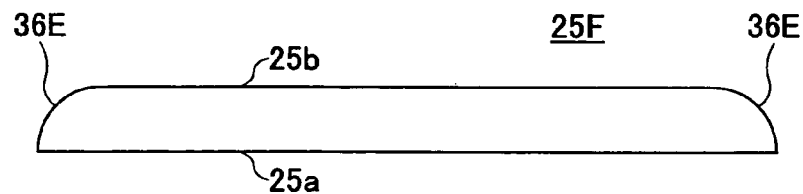

FIGS. 9A through 9C are diagrams showing variations of the transparent member 25C of the image capturing device 20C according to the third embodiment. Referring to FIG. 9A, a transparent member 25D is structured so that a side surface 36C thereof is formed in a stair-like manner.

Referring to FIG. 9B, a transparent member 25D has a vertical part 57 provided on the lower part of a side surface 36D thereof (on the first principal plane 25a side). Further, referring to FIG. 9C, a side surface 36E of a transparent member 25F is a curved surface having a curvature. In these transparent members 25D through 25F, the area of contact with the sealing resin 26 is also substantially increased compared with the configuration of the first embodiment and/or the anchoring effect is also produced.

In the transparent member 25D of FIG. 9A, the side surface 36C is formed in a stair-like manner, so that the surface area of the side surface 36C is increased so as to increase the area of contact with the sealing resin 26. In the transparent member 25E of FIG. 9B, the vertical part 57 is provided to eliminate the existence of an extremely thin part in the edge part on the first principal plane 25a side. As a result, it is possible to prevent the occurrence of damage such as a chip or crack to the edge part.

Further, in the transparent member 25F of FIG. 9C, the side surface 36E is curved, so that the surface area of the side surface 36E is increased so as to increase the area of contact with the sealing resin 26. Accordingly, by using the transparent member 25D, 25E, or 25F, the reliability of the image capturing device 20C can also be improved. In the transparent members 25D through 25F, the first principal plane 25a positioned on the image capturing element 22 side is also greater in area than the second principal plane 25b positioned on the outer side.

Next, a description is given of a fourth embodiment of the image capturing device according to the present invention.

Figure 10:
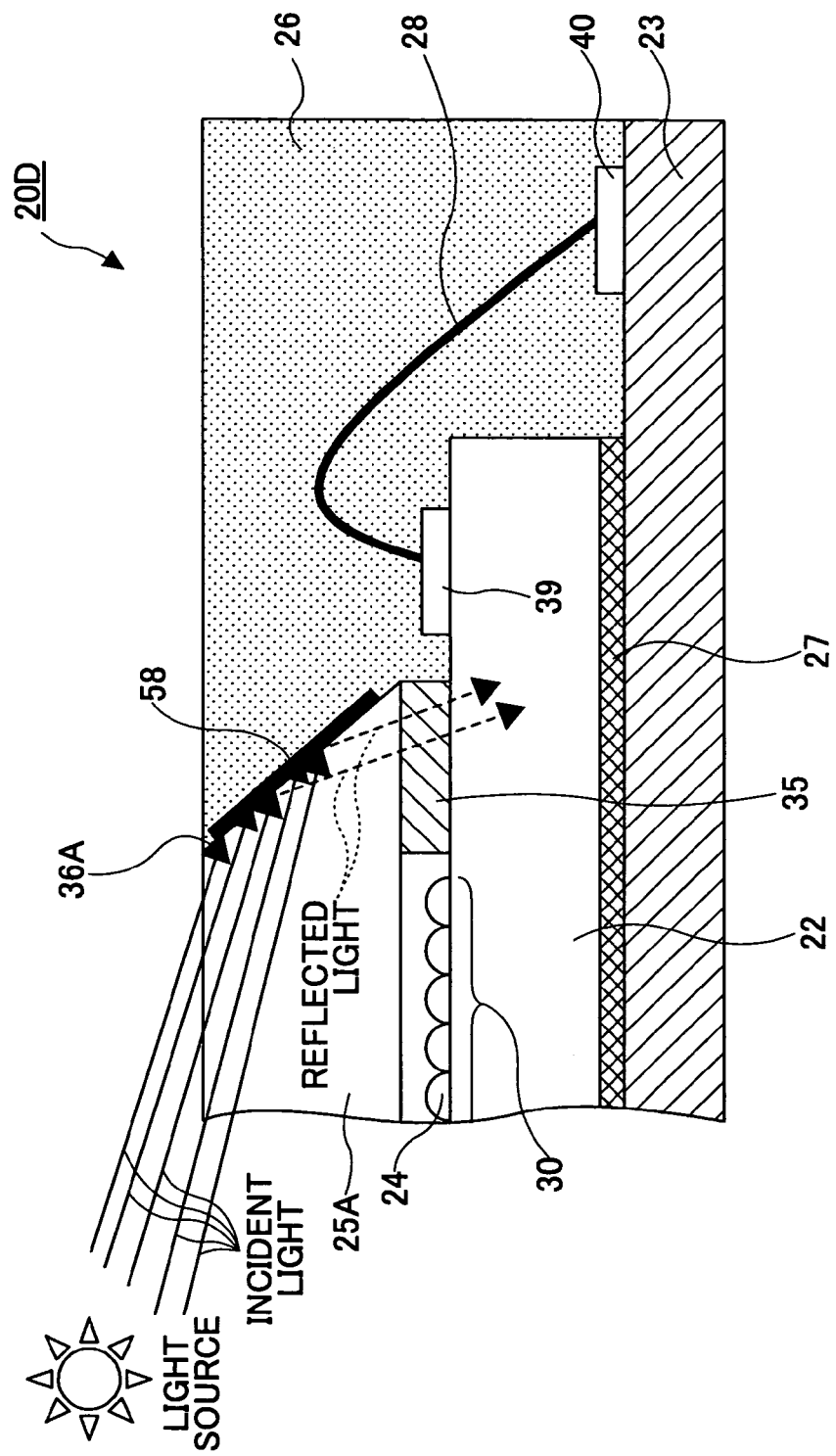
FIG. 10 is an enlarged cross-sectional view of part of an image capturing device according to a fourth embodiment of the present invention.

FIG. 10 is a cross-sectional view of part of an image capturing device 20D according to the fourth embodiment, in which the side surface 36A of the transparent member 25A and its vicinity are shown enlarged. In the image capturing device 20D according to this embodiment, a light-absorbing metal coating layer 58 of, for instance, nickel (Ni) or chromium (Cr) is provided on the side surface 36A of the transparent member 25A. In this transparent member 25A, the first principal plane 25a positioned on the image capturing element 22 side is greater in area than the second principal plane 25b positioned on the outer side.

The metal coating layer 58 may be formed by adhering metal foil to the side surface 36A. Alternatively, the metal coating layer 58 may be adhered to the side surface 36A by vapor deposition or sputtering. As a result of providing the metal coating layer 58 having a light absorbing characteristic to the side surface 36A of the transparent member 25A, light entering the side surface 36A is absorbed by the metal coating layer 58, so that reflected light is reduced. In addition, since the side surface 36A of the transparent member 25A is an inclined surface, the reflected light travels to the outside of the light receiving surface 30 (the light receiving area) of the image capturing element 22. Accordingly, the occurrence of a flare or ghost due to unnecessary light can be controlled with more reliability, so that the optical characteristics of the image capturing device 20D can be further improved.

Next, a description is given of a fifth embodiment of the image capturing device according to the present invention.

Figure 11:
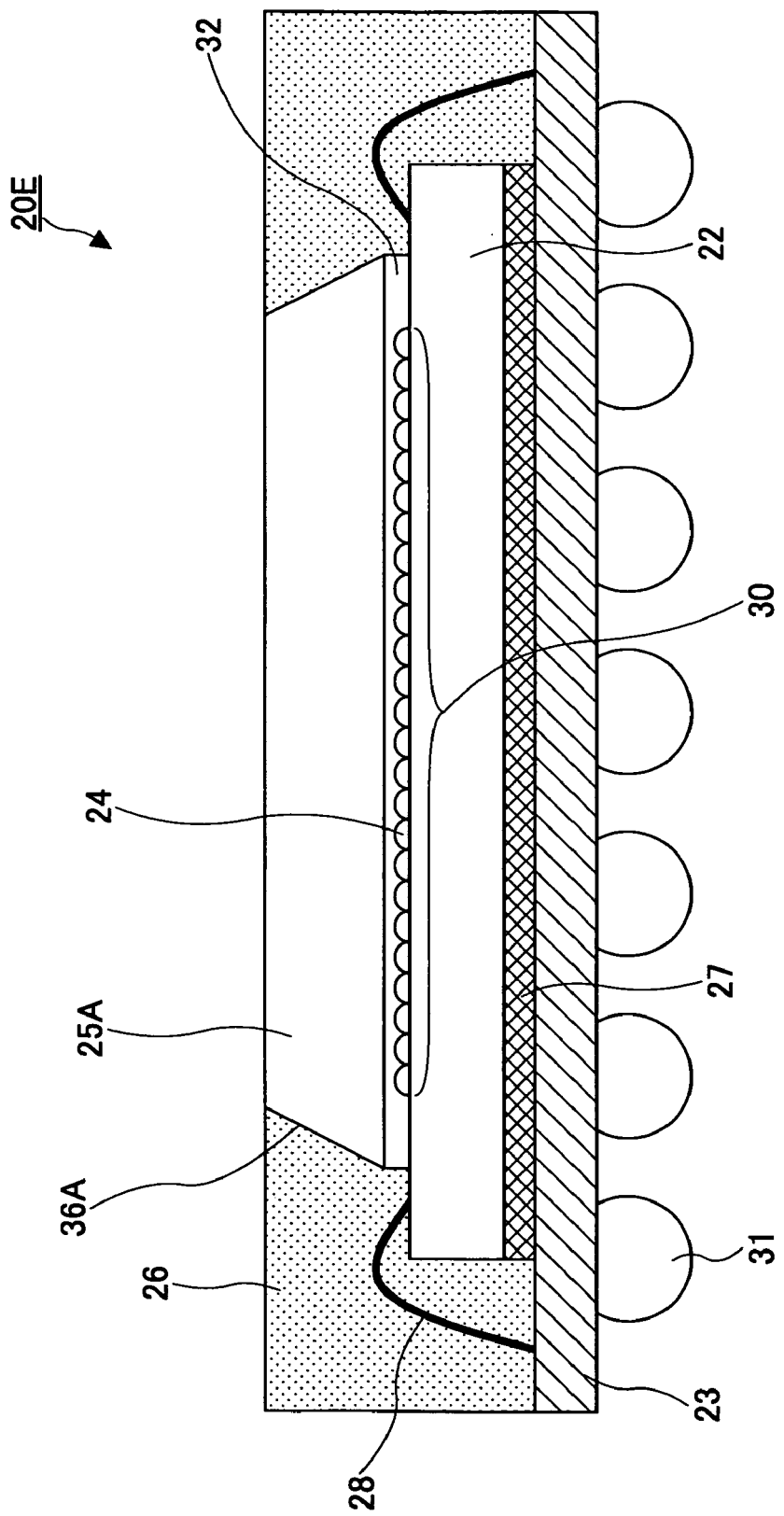
FIG. 11 is a cross-sectional view of an image capturing device according to a fifth embodiment of the present invention.

FIG. 11 is a cross-sectional view of an image capturing device 20E according to the fifth embodiment. In the image capturing device 20E, a light transmitting adhesive agent 32 is provided between the microlens 24 and the transparent member 25A provided on the light receiving surface 30 of the image capturing element 22. That is, according to this embodiment, the transparent member 25A is fixed on the light receiving surface 30 of the image capturing element 22 with the light transmitting adhesive agent 32. In the transparent member 25A, the first principal plane 25a positioned on the image capturing element 22 side is greater in area than the second principal plane 25b on the outer side.

In this configuration, a material having a lower refractive index than the microlens 24 is selected for the light transmitting adhesive agent 32 in order to increase its light gathering characteristics. According to the image capturing device 20E of this embodiment, no space exists between the image capturing element 22 and the transparent member 25A, and the part over the image capturing element 22 is formed of resin and glass. Accordingly, strength against an external force from above can be further increased in the image capturing device 20E.

Next, a description is given of a sixth embodiment of the image capturing device according to the present invention.

Figure 12:
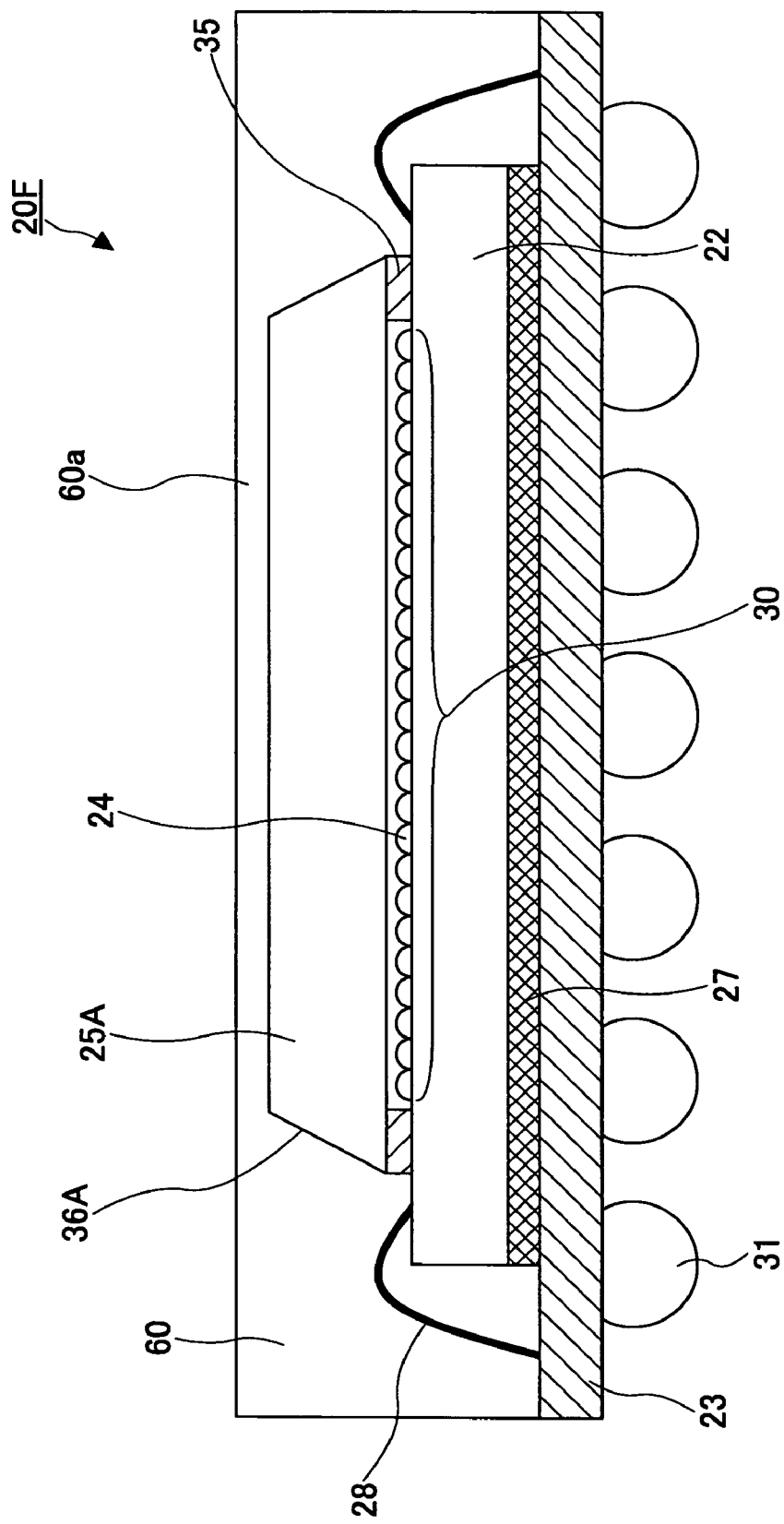
FIG. 12 is a cross-sectional view of an image capturing device according to a sixth embodiment of the present invention.

FIG. 12 is a cross-sectional view of an image capturing device 20F according to the fifth embodiment. In the image capturing device 20F according to this embodiment, optically transparent resin (hereinafter referred to as "transparent sealing resin 60") is employed as sealing resin, and the transparent member 25A is sealed (contained) inside the transparent sealing resin 60.

In the transparent member 25A, the first principal plane 25a positioned on the image capturing element 22 side is greater in area than the second principal plane 25b positioned on the outer side. In this configuration, no filler such as glass fiber or carbon is added to the transparent sealing resin 60.

In sealing the transparent member 25A in the transparent sealing resin 60, an upper sealing part 60a forming part of the transparent sealing resin 60 is formed with uniform thickness over the transparent member 25A. Accordingly, the incidence characteristics of incident light passing through the transparent member 25A are prevented from being impaired. Further, even when pressure due to thermal expansion is applied to the transparent member 25A, the transparent member 25A is held inside the transparent sealing resin 60. Accordingly, the image capturing device 20F can have increased reliability.

Next, a description is given of a seventh embodiment of the image capturing device according to the present invention.

Figure 13:
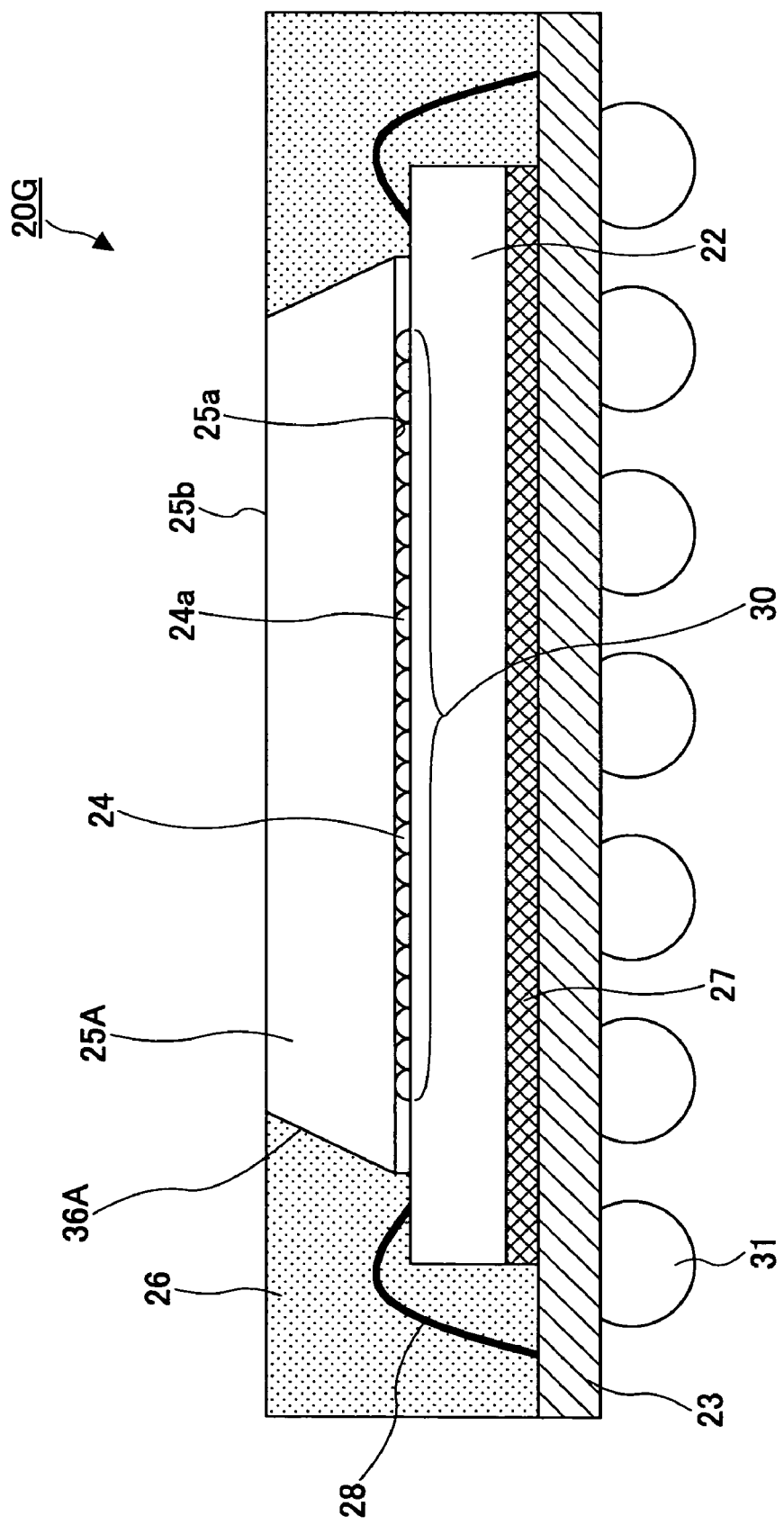
FIG. 13 is a cross-sectional view of an image capturing device according to a seventh embodiment of the present invention.

FIG. 13 is a cross-sectional view of an image capturing device 20G according to the seventh embodiment. In the image capturing device 20G of this embodiment, the transparent member 25A is provided so that its first principal plane 25a comes into direct contact with the microlens 24. In this configuration, the second principal plane 25b of the transparent member 25A is exposed from the sealing resin 26.

Figure 14:
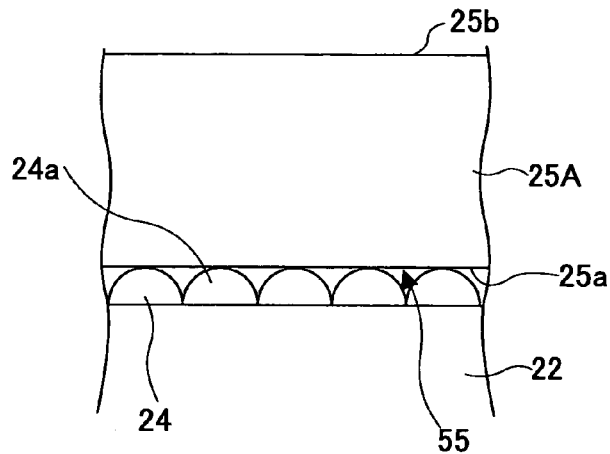
FIG. 14 is an enlarged view of part of the image capturing device according to the seventh embodiment of the present invention, showing a position at which a transparent member and a microlens are in contact with each other.
Figure 15:
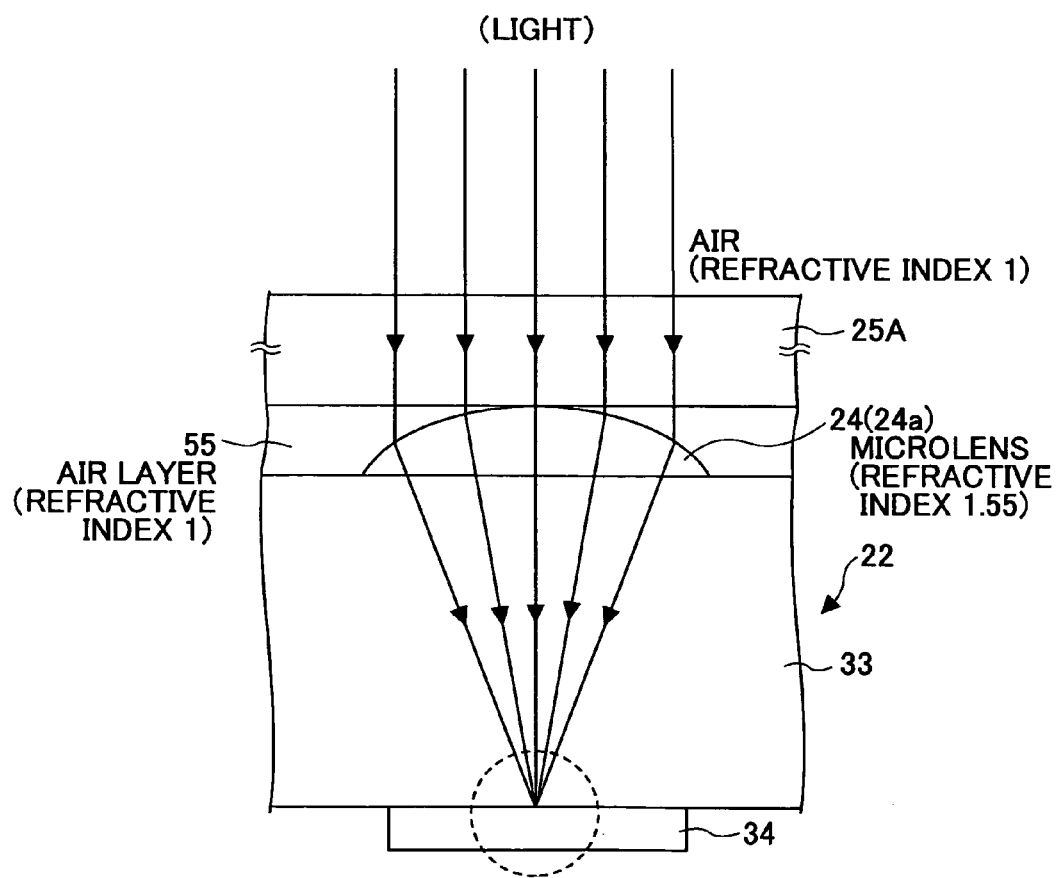
FIG. 15 is a schematic diagram for illustrating a condition of light gathering by the microlens in the image capturing device according to the seventh embodiment of the present invention.

As shown enlarged in FIG. 14, the microlens 24 is formed by arranging multiple lens bodies 24a projecting substantially hemispherically toward the first principal plane 25a of the transparent member 25A. Further, as shown enlarged in FIG. 15, the microlens 24 is provided on a color filter layer 33 provided on the image capturing element 22. The individual lens bodies 24a are arranged in a one-to-one correspondence with multiple photodiodes 34 formed on the light receiving surface 30 of the image capturing element 22. That is, the lens bodies 24a formed are more in number than or equal in number to the photodiodes 34.

According to this configuration, at the top of the substantially hemispheric lens parts of the lens bodies 24a, the transparent member 25A is supported by the lens parts of the lens bodies 24a in point contact therewith. Accordingly, the substantially entire surface of (the first principal plane 25a of) the transparent member 25A is supported by the microlens 24 (the lens bodies 24a) with multiple support points. However, since each lens body 24a includes a curved surface, an air layer 55 (refractive index: 1) exists between the transparent member 25A and the lens bodies 24a except for the part of direct contact as shown enlarged in FIG. 15. Therefore, there is a great difference in refractive index between each lens body 24a (refractive index: 1.55) and its ambient space (refractive index: 1). Accordingly, it can be ensured that incident light through the transparent member 25A is gathered to a photodiode area. Therefore, the output characteristics of the image capturing device 20G are prevented from being degraded.

The transparent member 25A is supported by the multiple lens bodies 24a. Therefore, the lens bodies 24a are substantially prevented from receiving loads or weights different from each other. Accordingly, none of the lens bodies 24a in particular is subject to change in its optical characteristics. In consequence, the optical characteristics of the image capturing device 20G are prevented from being degraded.

Next, a description is given, with reference to FIGS. 16A through 16G, of a method of manufacturing an image capturing device according to the present invention, taking a method of manufacturing the image capturing device 20E of the fifth embodiment as an example. In this embodiment, multiple image capturing devices 20E are formed in a single process. Therefore, a large-size substrate including multiple support substrates 23 for mounting an image capturing element is applied as a substrate. However, for convenience of graphical representation, a region corresponding to one of the multiple image capturing devices 20E formed using the large-size substrate is shown in FIGS. 16A through 16G, and the following description is given accordingly.

Figure 16A:
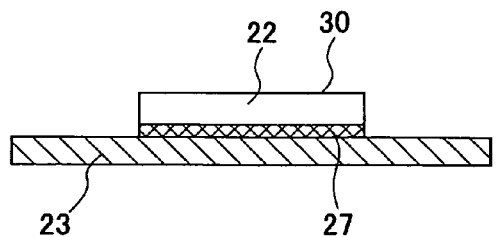
FIGS. 16A through 16G are diagrams for illustrating a method of manufacturing an image capturing device according to the present invention.

According to the present invention, first, as shown in FIG. 16A, the image capturing element 22 (a light receiving element) is mounted on and adhered to the glass epoxy support substrate 23 using the die bonding material 27. The support substrate 23 may be multilayered if necessary. A color filter layer and the microlens 24 (FIG. 11) are previously provided on the light receiving surface 30 of the image capturing element 22.

Figure 16B:
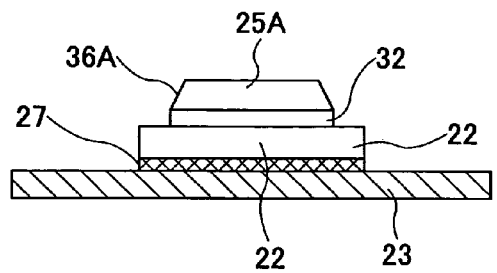

Next, as shown in FIG. 16B, the transparent member 25A is provided on and adhered to the microlens 24 (FIG. 11) of the image capturing element 22 using the light transmitting adhesive agent 32. The transparent member 25A is made of glass. According to the present invention, the principal plane 25a of the transparent member 25A on the image capturing element 22 side is greater in area than the second principal plane 25b thereof on the outer side. The peripheral side surface 36A thereof is inclined at an acute angle θ to the first principal plane 25a. A material having a lower refractive index than the microlens 24 (FIG. 11) is selected for the light transmitting adhesive agent 32.

The bonding of the image capturing element 22 to the support substrate 23 (die bonding) may be performed after adhering the transparent member 25A to the image capturing element 22. In order to prevent foreign bodies that impair optical characteristics from adhering to the microlens 24 (FIG. 11) of the image capturing element 22, it is desirable to cover the light receiving surface 30 of the image capturing element 22 with the transparent member 25A as early as possible.

Figure 16C:
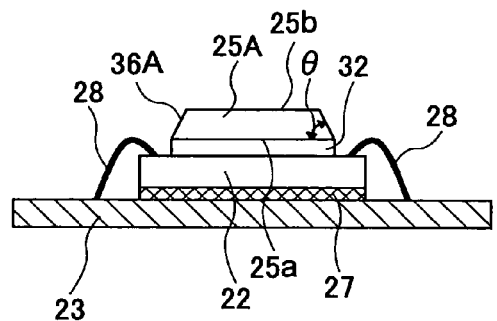

Next, when the transparent member 25A is fixed to the image capturing element 22, the electrode pads of the image capturing element 22 and the corresponding electrodes of the support substrate 23 are electrically connected by the wires 28 as shown in FIG. 16C. At this point, since the side surface 36A of the transparent member 25A is inclined, it is possible to prevent a bonding capillary (FIG. 4) from coming into contact with the transparent member 25A at the time of performing wire boding using the bonding capillary. This makes it unnecessary to reduce the transparent member 25A in size, and can also prevent an increase in the chip size of the image capturing element 22. As a result, the image capturing device 20E reduced in size and having good optical characteristics can be realized.

Figure 16D:
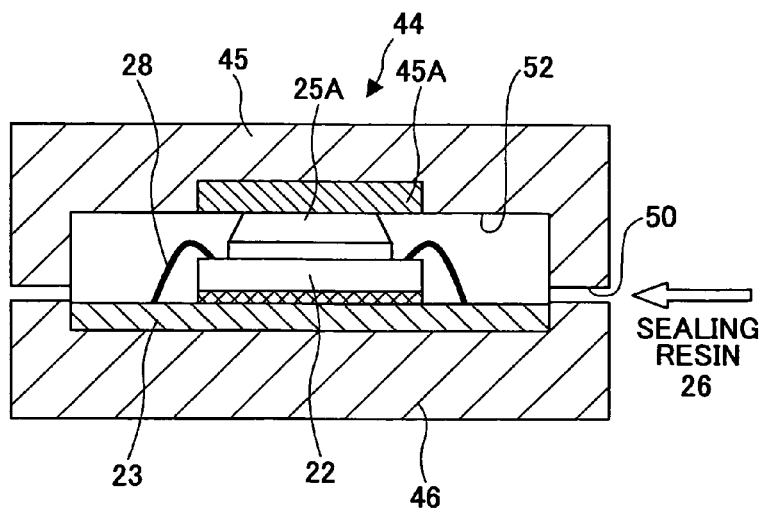

When this wire bonding is completed, the support substrate 23 is attached to a metal mold 44 so as to mold the sealing resin 26 as shown in FIG. 16D. Transfer molding is applied as a molding method. The metal mold 44 is composed of an upper metal mold 45 and a lower metal mold 46. The support substrate 23 is attached to the lower metal mold 46.

A cavity 52 is formed in the upper metal mold 45. The ceiling surface of the cavity 52 comes into contact with the upper surface of the transparent member 25A. At this point, in order to prevent the transparent member 25A from coming into direct contact with the metal part of the upper metal mold 45, heat resisting resin 45A is provided to at least part of the upper metal mold 45 which part comes into contact with the transparent member 25A. The provision of the heat resisting resin 45A prevents the occurrence of damage to the surface of (the second principal plane 25b of) the transparent member 25A. As the heat resisting resin 45A, for instance, DuPont™ Vespel® is applicable. A resin pod (not graphically represented) is connected to a resin inlet 50 of the metal mold 44 so that the sealing resin 26 is poured into the cavity 52 inside the metal mold 44 from the resin pod.

Figure 16E:
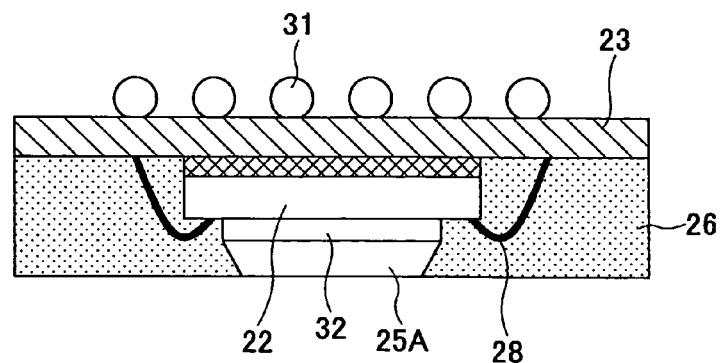
Figure 16F:
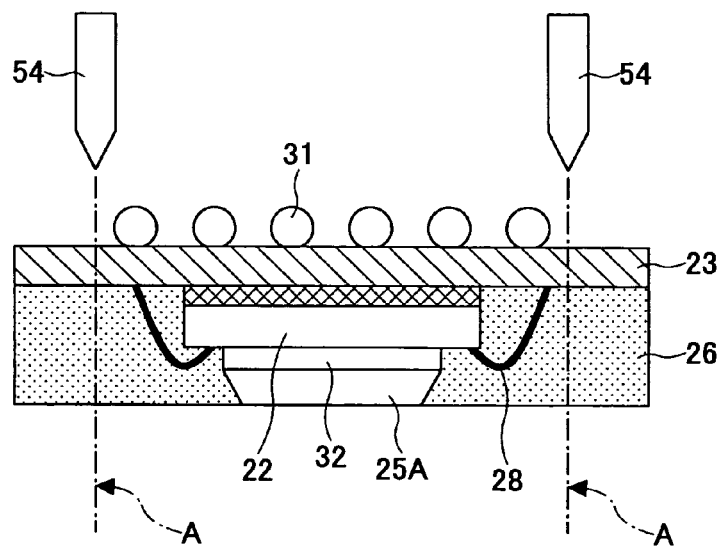
Figure 16G:
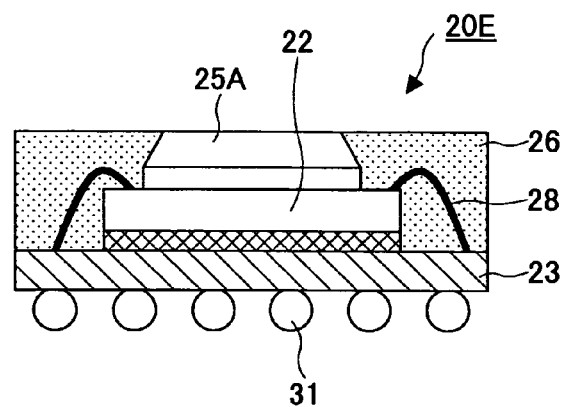

When the sealing resin 26 is hardened, the support substrate 23 is taken out of the metal mold 44. Next, as shown in FIG. 16E, the external connection terminals 31 formed of solder balls are formed on the multiple lands formed on the lower surface of the support substrate 23. Then, as shown in FIG. 16F, the support substrate 23 and the sealing resin 26 are cut along dicing lines A using a dicing saw 54, so that the large-size substrate is separated into the multiple image capturing devices 20E. Through the above-described process, the individual image capturing device 20E as shown in FIG. 16G is manufactured.

According to this manufacturing method, the large-size substrate including multiple support substrates 23 is employed to manufacture multiple image capturing devices 20E simultaneously. However, a method for manufacturing a single image capturing device 20E may be employed. Further, the above-described manufacturing method is also applicable in manufacturing any of the image capturing devices 20A through 20D, 20F, and 20G according to the above-described other embodiments.

The present invention is not limited to the specifically disclosed embodiments, and variations and modifications may be made without departing from the scope of the present invention.

What is claimed is:

1. An image capturing device, comprising:
   a support substrate;
   a light receiving element provided on the support substrate, the light receiving element having a light receiving surface;
   a spacer provided on the light receiving element;
   a plate-like transparent member provided over the light receiving surface of the light receiving element through the spacer, the plate-like transparent member including a first principal plane positioned on a side toward the light receiving element, a second principal plane opposite the first principal plane, and a peripheral side surface extending between the first principal plane and the second principal plane, the first principal plane being greater in area than the second principal plane, the peripheral side surface being inclined at an acute angle to the first principal plane;
   a light blocking resin provided on the peripheral side surface of the plate-like transparent member, a peripheral part of the light-receiving element, a peripheral part of the spacer, and the support substrate; and
   a lens member provided on the light receiving surface of the light receiving element in a space defined by the spacer, the light receiving element and the plate-like transparent member,
   wherein the plate-like transparent member is provided so as to be in direct contact with the lens member.

2. The image capturing device as claimed in claim 1 wherein an obtuse angle is formed between the second principal plane and the peripheral side surface of the plate-like transparent member.

3. The image capturing device as claimed in claim 1, wherein the peripheral side surface of the plate-like transparent member is roughened.

4. The image capturing device as claimed in claim 1, further comprising:
   a light absorbing coating provided on the peripheral side surface of the plate-like transparent member.

5. The image capturing device as claimed in claim 1, wherein the light-blocking resin seals the plate-like transparent member and the light receiving element on the support substrate.

6. The image capturing device as claimed in claim 1, wherein the light-blocking resin seals the plate-like transparent member so as to hold the inclined peripheral side surface thereof against a force to push the plate-like transparent member in a direction away from the light receiving element.

7. An image capturing device, comprising:
   a support substrate;
   a light receiving element provided on the support substrate, the light receiving element having a light receiving surface;
   a spacer provided on the light receiving element;
   a plate-like transparent member provided over the light receiving surface of the light receiving element through the spacer, the plate-like transparent member including a first principal plane positioned on a side toward the light receiving element, a second principal plane opposite the first principal plane, and a peripheral side surface extending between the first principal plane and the second principal plane, the first principal plane being greater in area than the second principal plane, the peripheral side surface including a perpendicular part extending from the first principal plane and an inclined part extending from the perpendicular part to the second principal plane; and a light-blocking resin provided on the peripheral side surface of the plate-like transparent member, a peripheral part of the light-receiving element, a peripheral part of the spacer, and the support substrate.

8. An image capturing device, comprising:

a support substrate;

a light receiving element provided on the support substrate, the light receiving element having a light receiving surface;

a spacer provided on the light receiving element;

a plate-like transparent member provided over the light receiving surface of the light receiving element through the spacer, the plate-like transparent member including a first principal plane positioned on a side toward the light receiving element, a second principal plane opposite the first principal plane, and a curved peripheral side surface extending between the first principal plane and the second principal plane, the first principal plane being greater in area than the second principal plane; and a light-blocking resin provided on the peripheral side surface of the plate-like transparent member, a peripheral part of the light-receiving element, a peripheral part of the spacer, and the support substrate; and a lens member provided on the light receiving surface of the light receiving element in a space defined by the spacer, the light receiving element and the plate-like transparent member, wherein the plate-like transparent member is provided so as to be in direct contact with the lens member.

9. An image capturing device, comprising:

a support substrate;

a light receiving element provided on the support substrate, the light receiving element having a light receiving surface;

a microlens provided on the light receiving element;

a plate-like transparent member provided over the light receiving surface of the light receiving element with the microlens provided therebetween, the plate-like transparent member including a first principal plane positioned on a side toward the light receiving element, a second principal plane opposite the first principal plane, and a peripheral side surface extending between the first principal plane and the second principal plane, the first principal plane being greater in area than the second principal plane, the peripheral side surface being inclined at an acute angle to the first principal plane; and a light-blocking resin provided on the peripheral side surface of the plate-like transparent member, a peripheral part of the light-receiving element, a peripheral part of the spacer, and the support substrate, wherein the plate-like transparent member is in point contact with the microlens.

10. An image capturing device, comprising:

a support substrate;

a light receiving element provided on the support substrate, the light receiving element having a light receiving surface;

a microlens provided on the light receiving element;

a plate-like transparent member provided over the light receiving surface of the light receiving element with the microlens provided therebetween, the plate-like transparent member including a first principal plane positioned on a side toward the light receiving element, a second principal plane opposite the first principal plane, and a peripheral side surface extending between the first principal plane and the second principal plane, the first principal plane being greater in area than the second principal plane, the peripheral side surface including a perpendicular part extending from the first principal plane and an inclined part extending from the perpendicular part to the second principal plane; and a light-blocking resin provided on the peripheral side surface of the plate-like transparent member, a peripheral part of the light-receiving element, a peripheral part of the spacer, and the support substrate, wherein the plate-like transparent member is in point contact with the microlens.

11. An image capturing device, comprising:

a support substrate;

a light receiving element provided on the support substrate, the light receiving element having a light receiving surface;

a microlens provided on the light receiving element;

a plate-like transparent member provided over the light receiving surface of the light receiving element with the microlens provided therebetween, the plate-like transparent member including a first principal plane positioned on a side toward the light receiving element, a second principal plane opposite the first principal plane, and a curved peripheral side surface extending between the first principal plane and the second principal plane, the first principal plane being greater in area than the second principal plane; and a light-blocking resin provided on the peripheral side surface of the plate-like transparent member, a peripheral part of the light-receiving element, a peripheral part of the spacer, and the support substrate, wherein the plate-like transparent member is in point contact with the microlens.

* * * * *

UNITED STATES PATENT AND TRADEMARK OFFICE
CERTIFICATE OF CORRECTION

| | | |
|---|---|---|
| PATENT NO. | : 7,616,250 B2 | |
| APPLICATION NO. | : 10/994634 | |
| DATED | : November 10, 2009 | |
| INVENTOR(S) | : Watanabe et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 770 days.

Signed and Sealed this
Third Day of May, 2011

David J. Kappos
*Director of the United States Patent and Trademark Office*